(12) United States Patent
Nagano et al.

(10) Patent No.: US 6,719,924 B2
(45) Date of Patent: Apr. 13, 2004

(54) SUPERCONDUCTING DEVICE AND METHOD OF MANUFACTURING THE SAME

(75) Inventors: Toshihiko Nagano, Kawasaki (JP); Jiro Yoshida, Yokohama (JP)

(73) Assignees: Kabushiki Kaisha Toshiba, Tokyo (JP); International Superconductivity Technology Center, Tokyo (JP)

( * ) Notice: Subject to any disclaimer, the term of this patent is extended or adjusted under 35 U.S.C. 154(b) by 98 days.

(21) Appl. No.: 09/984,563

(22) Filed: Oct. 30, 2001

(65) Prior Publication Data

US 2002/0074626 A1 Jun. 20, 2002

(30) Foreign Application Priority Data

Oct. 31, 2000  (JP) .......................... 2000-333578

(51) Int. Cl.$^7$ .................. H01L 21/00; H01L 29/06; H01L 39/22

(52) U.S. Cl. ................ 252/518.1; 252/519.15; 252/521.1; 505/234; 505/125; 505/126; 505/190; 505/191; 505/193; 423/604; 423/583

(58) Field of Search ................ 505/125, 126, 505/190, 191, 193, 329, 234; 257/31, 32, 33; 252/500, 509, 578.1, 519.15, 521.1; 427/126.3, 226; 423/604, 583

(56) References Cited

U.S. PATENT DOCUMENTS

| | | | |
|---|---|---|---|
| 4,916,115 A | * | 4/1990 | Mantese et al. ........... 505/413 |
| 5,106,823 A | | 4/1992 | Creuzet et al. |
| 5,151,409 A | * | 9/1992 | Hiratani et al. ............ 505/125 |
| 6,188,919 B1 | * | 2/2001 | LaGraff et al. ............ 505/190 |

FOREIGN PATENT DOCUMENTS

| | | | | |
|---|---|---|---|---|
| JP | 294285 A1 | * | 12/1988 | ........... H01L/39/24 |
| JP | 63-132946 | * | 4/1989 | ........... C01G/3/20 |
| JP | 01-145878 | * | 6/1989 | ........... H01L/39/22 |
| JP | 10-074989 | * | 3/1998 | ........... H01L/39/02 |
| JP | 2908346 | | 4/1999 | |

OTHER PUBLICATIONS

Katsuya Yamagiwa et al.; "Orientation Behavior of REBa2Cu3O7−y (RE=Rare Earth and Y) Films"; Jpn. J. Phys. Vol 39 (2000); pp. 452–457.

Kozo Osamura et al.; Phase Diagrams of Ln—Ba—Cu—O Systems (Ln=Lanthanide);Z. Metallkd. 84(1993) 8, pp. 552–528.

* cited by examiner

*Primary Examiner*—Margaret Einsmann
*Assistant Examiner*—Kallambella Vijayakumar
(74) *Attorney, Agent, or Firm*—Finnegan, Henderson, Farabow, Garrett & Dunner, L.L.P.

(57) ABSTRACT

There is provided a superconducting device including a substrate, a first superconductor layer supported by the substrate and containing Ln, AE, M and O, and a second superconductor layer containing a material represented by a formula of $(Yb_{1-y}Ln'_y)AE'_2M'_3O_z$, the first and second superconductor layers forming a junction, and atomic planes each including M and O in the first superconductor layer and atomic planes each including M' and O in the second superconductor layer being discontinuous to each other in a position of the junction, wherein each of Ln and Ln' represents at least one metal of Y and lanthanoids, each of AE and AE' represents at least one of alkaline earth metals, each of M and M' represents a metal which contains 80 atomic % or more of Cu, y represents a value between 0 and 0.9, and z represents a value between 6.0 and 8.0.

11 Claims, 6 Drawing Sheets

SUPERCONDUCTING DEVICE AND METHOD OF MANUFACTURING THE SAME

CROSS-REFERENCE TO RELATED APPLICATIONS

This application is based upon and claims the benefit of priority from the prior Japanese Patent Application No. 2000-333578, filed Oct. 31, 2000.

BACKGROUND OF THE INVENTION

The present invention relates to a superconducting device and a method of manufacturing the same, particularly, to a superconducting device using an oxide superconductor and a method of manufacturing the same.

It is expected that an oxide superconductor will be utilized in a technical field requiring a high speed operation such as a super-high speed logic arithmetic device or a communication infrastructure. For realizing the utilization of the oxide superconductor, it is said to be of a high priority to establish at an early date a method of manufacturing a Josephson device that is a basic constituting element.

Josephson devices of a laminated type, a ramp edge type, a grain boundary junction type, and a step edge type are known to the art. Each of these Josephson devices is constructed such that a plurality of oxide thin films including a superconductor layer are laminated one upon the other. In the manufacturing process of the Josephson device, after the formation of one or some of the oxide thin films, etching and annealing processes are applied to the resultant structure. As a result, a non-superconductor layer is formed to constitute an interface between a first superconductor layer and a second superconductor layer. Alternatively, defects or dislocations are introduced between the first superconductor layer and the second superconductor layer so as to form an interface.

The construction of the interface highly influences the characteristics of the Josephson device that is finally obtained. Therefore, it is necessary to control with a high accuracy the defects and the dislocation density in the interface. However, the prior art gives rise to the following problem in conjunction with such a process. The problem will now be described, with the forming process of a ramp edge type junction, which is a typical type of junction, taken as an example.

In the forming process of a ramp edge type junction, which does not use a ground plane, in the first step, a superconductor layer used as a base electrode and an insulation layer are successively formed on a substrate so as to obtain a two-layer film. The substrate is generally made of, for example, $SrTiO_3$, MgO, La—Sr—Al—Ta—O oxide, $NdGaO_3$, $LaAlO_3$, or YSZ (Yttrium Stabilized Zirconia). On the other hand, each of the base electrode and a counter electrode referred to herein later is made of, for example, Y—Ba—Cu—O oxide, Nb—Ba—Cu—O oxide, Bi—Sr—Ca—Cu—O oxide, Ti—Ba—Cu—O oxide or (Ba, K)$BiO_3$ oxide. In this case, the base electrode is made of $YB_2Cu_3O_7$ or $NdBa_2Cu_3O_7$.

In a second step, a resist pattern is formed on the insulation layer by using a photolithography technique, followed by patterning the insulation layer by an ion milling method or a wet etching method, with the resist pattern used as a mask. As a result, the base electrode is partly exposed to the outside. In this step, a change in structure such as deviation from the inherent composition and change into the amorphous structure takes place in the exposed surface region of the base electrode. Where, for example, the base electrode is made of $YBa_2Cu_3O_7$, the composition analysis using an XPS indicates that a layer prominently rich in Y is formed in a thickness of about 2 nm in the exposed surface of the base electrode. It is known to the art that the particular layer is amorphous.

Then, in a third step, a high temperature annealing treatment is applied to the two-layer film partially exposing the base electrode to the outside under vacuum or under an oxygen atmosphere. By this heat treatment, the exposed surface region of the base electrode is changed into a layer differing from the inherent structure so as to act as a barrier layer, or forms dislocations or defects in the base electrode and a counter electrode formed in the subsequent step so as to produce the effect of exhibiting the Josephson characteristics. For example, where the base electrode is made of $YBa_2Cu_3O_7$, the component analysis using an XPS and the structure analysis using an electron microscope indicate that the exposed surface region of the base electrode after the heat treatment noted above contains Y, Ba, Cu and oxygen atoms and that there are a case where a crystal phase of an oxide having a thickness of about 1 nanometer to about several nanometers is grown, and another case where a crystal phase is not present and lattice defects and dislocations are observed in a high density over the entire interface.

In a fourth step, a superconductor layer used as a counter electrode is formed on the two-layer film after the heat treatment. The counter electrode is made of, for example, $YBa_2Cu_3O_7$. The basic manufacturing process of the Josephson device is finished by the fourth step. However, in order to form the electrode with a high stability, employed are the step of forming a Au layer on the counter electrode and the step of processing the counter electrode into an optional shape.

The manufacturing process described above is directed to a ramp edge type device, and a similar process is employed for the manufacture of the Josephson device of another type such as a laminated type. Also, the manufacturing process described above is directed to the case where the ground plane is not used. However, a process substantially equal to the manufacturing process described above is performed on an insulation film formed on the ground plane.

In order to form a super-high speed logic circuit by using a superconducting device, it is absolutely necessary to make optimum both the critical current ($I_c$) value of the junction and the inductance ($L_c$) of the wiring portion, which are basic parameters for describing characteristics of the device. When it comes to, for example, the ramp edge type junction, which is a typical device type, it is desirable for $I_c$ to be about 1 mA and for $L_c$ to be about $0.7 \times 10^{-12}$H or less, in the case where the base electrode has a thickness of 200 nm and a junction width of 4 $\mu$m.

Where $YBa_2Cu_3O_7$ or $NdBa_2Cu_3O_7$ is used as a material of the base electrode and $YBa_2Cu_3O_7$ is used as a material of the counter electrode, it was customary to set the temperature for the annealing treatment at a level substantially equal to the substrate temperature in the step of forming the counter electrode. Also, where $YBa_2Cu_3O_7$ is used as a material of the counter electrode, it is necessary to allow the base electrode to have the (001) orientation in order to lower the $L_s$ value and to manufacture an element having good surface properties. It is generally known in this connection that $YBa_2Cu_3O_7$ forms the (001) orientation only at a temperatures of 750° C. or higher, and that $YBa_2Cu_3O_7$ forms mainly the (100) orientation at a temperature lower than 750° C. Under the circumstances, where the substrate temperature is set at a high level at which the (001) orientation can be achieved, the annealing temperature is rendered excessively high, with the result that the $I_c$ value deviates from the desired value and the flux flow-like characteristics are observed in many cases.

Also, it is known to the art that the $I_c$ value is generally lowered in the case where the annealing temperature and the substrate temperature are lowered, provided that the other conditions are the same. It follows that it is possible to lower the $I_c$ value to a desired level by utilizing the particular phenomenon, i.e., by lowering the substrate temperature, in the annealing step and in the step of forming the counter electrode. However, the particular method causes a large amount of the (100) orientation to be present together in the counter electrode. As a result, a lowering of the critical current ($J_c$) of the wiring portion, which causes the elevation of the $L_s$ value, occurs so as to adversely affect the high speed operation of the device.

As described above, in the prior art, the range of the substrate temperature causing the counter electrode to have the (001) orientation sufficiently is higher than the range of the substrate temperature capable of realizing a desired $I_c$ value. These two ranges overlap each other only slightly, or do not overlap each other at all. Under the circumstances, it was difficult to simultaneously realize sufficient orienting properties and a desired $I_c$ value.

BRIEF SUMMARY OF THE INVENTION

An object of the present invention is to provide a superconducting device capable of optimizing easily both the critical current value of the junction and the inductance value of the wiring portion and a method of manufacturing the same.

According to a first aspect of the present invention, there is provided a superconducting device, comprising a substrate, a first superconductor layer supported by the substrate and comprising Ln, AE, M and O, wherein Ln represents at least one metal selected from the group comprising Y and lanthanoids, AE represents at least one of alkaline earth metals, and M represents a metal which contains 80 atomic % or more of Cu, and a second superconductor layer comprising a material represented by a formula of $(Yb_{1-y}Ln'_y)AE'_2M'_3O_z$ in which Ln' represents at least one metal selected from the group comprising Y and lanthanoids, AE' represents at least one of alkaline earth metals, M' represents a metal which contains 80 atomic % or more of Cu, y represents a value within a range of 0 to 0.9, and z represents a value within a range of 6.0 to 8.0, the first and second superconductor layers forming a junction, and atomic planes each including M and O in the first superconductor layer and atomic planes each including M' and O' in the second superconductor layer being discontinuous to each other in a position of the junction.

According to a second aspect of the present invention, there is provided a superconducting device, comprising a substrate, a first superconductor layer supported by the substrate and comprising Ln, AE, M and O, wherein Ln represents at least one metal selected from the group comprising Y and lanthanoids, AE represents at least one of alkaline earth metals, and M represents a metal which contains 80 atomic % or more of Cu, and a second superconductor layer comprising a material represented by a formula of $(Yb_{1-y}Ln'_y)AE'_2M'_3O_z$ in which Ln' represents at least one metal selected from the group comprising Y and lanthanoids, AE' represents at least one of alkaline earth metals, M' represents a metal which contains 80 atomic % or more of Cu, y represents a value within a range of 0 to 0.9, and z represents a value within a range of 6.0 to 8.0, at least a portion of the first superconductor layer intervening between the substrate and the second superconductor layer, the first and second superconductor layers forming a junction, atomic planes each including M and O in the first superconductor layer and atomic planes each including M' and O in the second superconductor layer being discontinuous to each other in a position of the junction, and a decomposition temperature of the first superconductor layer being higher than a decomposition temperature of the second superconductor layer.

According to a third aspect of the present invention, there is provided a method of manufacturing a superconducting device, comprising subjecting a first superconductor layer, which is supported by a substrate and containing superconductor of oxide, to an etching treatment, subjecting the first superconductor layer to a heat treatment after the etching treatment, and forming a second superconductor layer on the first superconductor layer after the heat treatment, the second superconductor layer comprising a material represented by a formula of $(Yb_{1-y}Ln'_y)AE'_2M'_3O_z$ in which Ln' represents at least one metal selected from the group comprising Y and lanthanoids, AE' represents at least one of alkaline earth metals, M' represents a metal which contains 80 atomic % or more of Cu, y represents a value within a range of 0 to 0.9, and z represents a value within a range of 6.0 to 8.0.

It is noted that a construction defined by the above expression of "atomic planes each including M and O in the first superconductor layer and atomic planes each including M' and O in the second superconductor layer being discontinuous to each other in a position of the junction" includes a construction in which the atomic planes each including M and O in the first superconductor layer and the atomic planes each including M' and O in the second superconductor are displaced from each other in a direction parallel to the interface between the first and second superconductor layers, a construction in which an interface deviated from the inherent compositions of these superconductor layers is present between the first and second superconductor layers, and a construction in which an interface that is made amorphous is present between the first and second superconductor layers. When the atomic planes in the first and second superconductor layers are $CuO_2$ planes, the particular construction in question covers, for example, the case where the $CuO_2$ planes in the first superconductor layer and the $CuO_2$ planes in the second superconductor layer are displaced from each other in the position of the junction. Also, an expression "(abc) orientation" is used herein later in conjunction with the crystal layer in which the (abc) plane is exposed to the outside. For example, the layer of (001) orientation represents a layer in which the (001) plane is exposed to the outside. Further, the term "decomposition temperature" or "decomposition reaction starting temperature" denotes the temperature at which the congruent melt, the peritectic melt or the eutectic melt occurs when an oxide superconductor is heated.

In the first and third aspects of the present invention, at least a part of the first superconductor layer may intervene between the substrate and the second superconductor layer. To be more specific, for example, the first and second superconductor layers may be a base electrode and a counter electrode, respectively. Alternatively, the first and second superconductor layers may be juxtaposed on the substrate.

In the first and third aspects of the present invention, the composition of the first superconductor layer may be different from or equal to the composition of the second superconductor layer.

In the first to third aspects of the present invention, Ln and Ln' may be the same or different from each other. Also, AE and AE' may be the same or different from each other. Further, M and M' may be the same or different from each other.

In the first to third aspects of the present invention, the first superconductor layer may be an oxide superconductor layer comprising a material represented by a formula of $LnAE_2M_3O_x$. Also, in this formula, x may be a value within a range of 6.0 to 8.0 or within a range of 6.0 to 7.5.

In the first to third aspects of the present invention, each of AE and AE' may be at least one metal selected from the group comprising Ca, Ba and Sr. Also, the value of z in the formula may fall within a range of 6.0 to 7.5.

In the first to third aspects of the present invention, the superconducting device may be a ramp edge type Josephson device or a laminated type Josephson device. Also, the superconducting device may be another type of Josephson device.

In the third aspect of the present invention, the temperature of the substrate in forming the second superconductor layer may be lower than the temperature of the substrate in applying a heat treatment to the substrate.

Further, in the first to third aspects of the present invention, the superconducting device may include a plurality of junctions. In this case, it suffices for the definitions given above to be satisfied in at least one of these junctions.

DETAILED DESCRIPTION OF THE INVENTION

As described above, the problems inherent in the prior art are derived from the situation that the range of the substrate temperature within which the counter electrode can be formed in a desired orientation is higher than the temperature range within which a desired $I_c$ value can be realized and that these temperature ranges overlap each other only slightly or do not overlap each other at all. In other words, it is possible to optimize easily both the critical temperature value of the junction and the inductance value of the wiring portion by allowing these two temperature ranges to overlap each other over a greater region.

It is possible to allow the two temperature ranges to overlap each other over a greater region by, for example, lowering the lowest substrate temperature at which the counter electrode can be formed in a desired orientation and/or by increasing the highest substrate temperature at which a desired $I_c$ value can be realized. In the first embodiment of the present invention, the lowest substrate temperature at which the counter electrode can be formed in a desired orientation is lowered as described herein later. Also, in the second embodiment of the present invention, the lowest substrate temperature at which the counter electrode can be formed in a desired orientation is lowered, and the highest substrate temperature at which a desired $I_c$ value can be realized is increased.

The first embodiment of the present invention will now be described first.

A superconducting device according to a first embodiment of the present invention includes first and second superconductor layers, and these first and second superconductor layers form a junction. The first conductor layer is an oxide superconductor layer comprising Ln, AE, M and O. On the other hand, the second superconductor layer is an oxide superconductor layer comprising a material having a composition represented by the formula of $(Yb_{1-y}Ln'_y)AE'_2M'_3O_z$. It should be noted that the atomic planes each including M and O in the first superconductor layer and the atomic planes each including M' and O in the second superconductor layer are discontinuous to each other in a position of the junction.

Let us describe first as an example a superconducting device in which the first superconductor layer constitutes the base electrode and the second superconductor layer constitutes the counter electrode.

Figure 1:
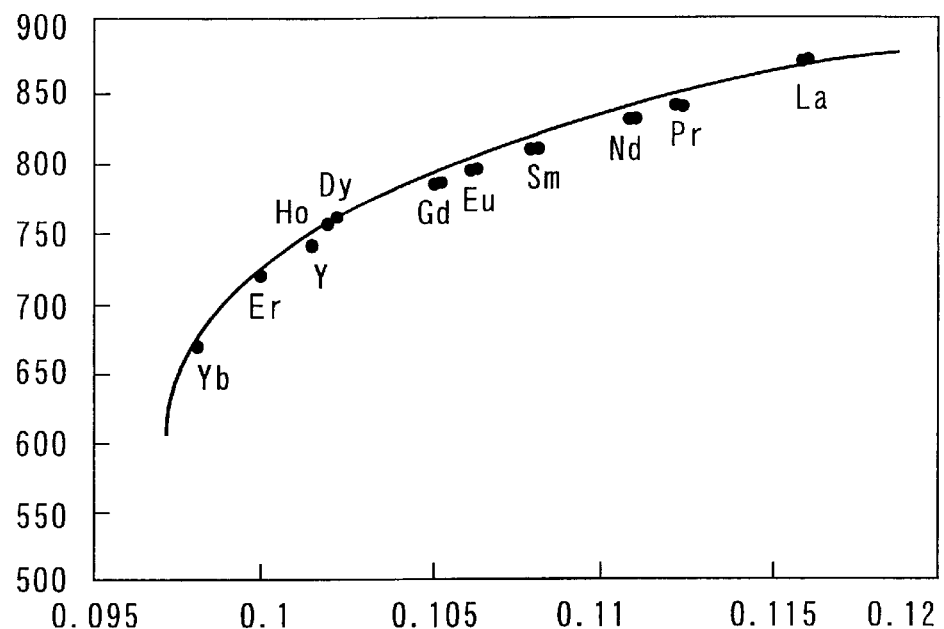
FIG. 1 is a graph showing the relationship between the lowest substrate temperature realizing the (001) orientation in the counter electrode made of a material represented by the formula of $Ln'AE'_2M'_3O_7$ and the ionic radius of the element Ln'.

FIG. 1 is a graph showing the relationship between the lowest substrate temperature realizing the (001) orientation in the counter electrode made of a material having a composition represented by the formula of $Ln'AE'_2M'_3O_7$ and the ionic radius of the element Ln'. The ionic radius is plotted in the abscissa of the graph, with the lowest substrate temperature being plotted on the ordinate.

Each of the thin films corresponding to the data shown in FIG. 1 has a crystal structure close to the crystal structure of the conventional $YBa_2Cu_3O_7$ thin film and is formed by a method similar to the method of forming the $YBa_2Cu_3O_7$ thin film. To be more specific, employed was a 90° off-axis sputtering method in which the Ar flow rate was set at 100 sccm, the oxygen flow rate was set at 50 sccm, the total pressure was set at 200 mTorr, and the substrate temperature was set at 500 to 900° C. Also, a single target made of an LnBCO sintered body was used as the sputter target. Further, the lowest value of the substrate temperature at which the counter electrode can be formed in the (001) orientation, i.e., the c-axis orientation, was defined to be the temperature at which the ratio I (200)/I (005) of the peak intensity I (200) of the (200) plane perpendicular to the a-axis to the peak intensity I (005) of the (005) plane perpendicular to the c-axis, which are observed in the XRD measurement, is 0.1.

As shown in FIG. 1, the lowest substrate temperature tends to be lowered with decrease in the ionic radius of the element Ln. Particularly, where the element Ln' represents Yb, the lowest substrate temperature is lower by at least 50° C. than that in the case where the element Ln' represents Y. As a result, it is possible to form the counter electrode of the (001) orientation at a substrate temperature markedly lower than that in the prior art by using Yb as the element Ln'. It follows that it is possible to easily optimize both the critical current value at the junction and the inductance value of the wiring portion.

The particular effect is most prominent in the case where the site of the element Ln' in the counter electrode is occupied by only Yb. However, it is possible for the site of the element Ln' to be occupied partly by Yb and for the remaining site to be occupied by the lanthanoide metal other than Yb or by Y. In other words, in the composition of the counter electrode, which is schematically represented by the formula of $(Yb_{1-y}Ln'_y)AE'_2M'_3O_z$, it is possible in principle for the value of y to be equal to or larger than 0 and to be smaller than 1.

In the formula given above, Ln' represents at least one metal selected from the group including Y and lanthanoids. Also, AE' represents at least one metal of alkaline earth metals such as Ca, Ba and Sr. Further, M' represents a metal containing at least 80 atomic %, preferably at least 90 atomic %, of Cu.

Where the value of y in the formula noted above is excessively large, the effect described above cannot be produced in general in an appreciable degree. Since the effect described above can be produced in an appreciable degree if the value of y is not larger than 0.9, the value of y should fall within a range of 0 to 0.9.

Also, in the formula described above, the value of z should fall within a range of 6.0 to 8.0, preferably a range of 0.6 to 7.5. If the value of z is smaller than the lower limit noted above, a decomposition reaction into another substance takes place so as to make it difficult to obtain the counter electrode exhibiting the superconductor characteristics. Also, in many cases, it is known to the art that the value of z is smaller than the upper limit noted above.

In the first embodiment of the present invention, it is possible for the base electrode to be made of an oxide superconductor comprising a material having a composition represented by, for example, the formula of $LnAE_2M_3O_x$. It is also possible for the base electrode to consist essentially of a material having a composition represented by the formula of $(Yb_{1-w}Ln_w)AE_2M_3O_x$. In this formula, Ln represents at least one metal selected from the group including Y and lanthanoide metals. Also, AE represents at least one metal of alkaline earth metals such as Ca, Ba and Sr. Further, M represents a metal containing at least 80 atomic %, preferably at least 90 atomic %, of Cu. On the other hand, the value of w falls within a range of 0 to 0.9, and the value of x falls within a range of 6.0 to 8.0, preferably a range of 6.0 to 7.5.

As described above, in the first embodiment of the present invention, the overlapping region between the range of the substrate temperature within which the counter electrode can be formed in a desired orientation and the range of the substrate temperature within which a desired $I_c$ value can be realized is increased by using a material, which is capable of forming a film in a desired orientation even if the substrate temperature is relatively low, for forming the counter electrode. As a result, it is possible to optimize easily both the critical current value of the junction and the inductance value of the wiring portion. It follows that, according to the first embodiment of the present invention, it is possible to markedly improve the controllability in the construction and the electrical characteristics of the junction portion between the counter electrode and the base electrode. In addition, it is possible to improve the reproducibility of the characteristics. Under the circumstances, it is possible to drastically improve the function of the high speed logic arithmetic element using the high temperature superconductor Josephson junction so as to further improve the high speed operation and to enlarge the capacity of the communication infrastructure technology.

The description given above covers the case where the first superconductor layer constitutes the base electrode and the second superconductor layer constitutes the counter electrode. However, it is possible to put the first and second superconductor layers side by side in the first embodiment of the present invention.

A second embodiment of the present invention will now be described.

The second embodiment of the present invention is equal to the first embodiment described above, except that, in the second embodiment, the first superconductor layer lies between the substrate and the second superconductor layer, and that the decomposition temperature of the first superconductor layer is higher than the decomposition temperature of the second superconductor layer. Therefore, the overlapping explanations are omitted in the following description.

Where the annealing temperature is high, the $I_c$ value is deviated from the desired value in the prior art. The difficulty is caused mainly by the deterioration of the interface. The deterioration of the interface is deeply related to the decomposition temperature of the base electrode. Where the decomposition temperature (or the decomposition reaction starting temperature) of the base electrode is higher than the decomposition temperature of the counter electrode, it is possible to suppress the deviation of the composition in the surface region, which has been made amorphous, of the base electrode from the inherent composition in the second step and to suppress the formation of the decomposing reaction product in the interface and the degradation in the flatness of the interface after the heat treatment in the third and fourth steps, even if the substrate temperature in the step of forming the counter electrode is relatively high. It follows that, according to the second embodiment of the present invention, it is possible to further increase the overlapping region between the range of the substrate temperature within which the upper substrate can be formed in a desired orientation and the range of the substrate temperature within which a desired $I_c$ value can be realized. In other words, according to the second embodiment of the present invention, it is possible to optimize more easily both the critical current value of the junction and the inductance value of the wiring portion.

In the second embodiment of the present invention, the decomposition reaction starting temperature of the base electrode is higher preferably by at least 30° C., more preferably by at least 60° C., and most preferably by at least 100° C., than the decomposition reaction starting temperature of the counter electrode. In general, the above-noted effect is rendered prominent with an increase in the temperature difference noted above.

For example, in the case where $EuBa_2Cu_3O_7$ is used as a material of the base electrode and $YbBa_2Cu_3O_7$ is used as a material of the counter electrode, the decomposition reaction starting temperature of the base electrode is higher by at least 100° C. than that of the counter electrode. In the case where $YBa_2Cu_3O_7$ is used as a material of the base electrode and $YbBa_2Cu_3O_7$ is used as a material of the counter electrode, the decomposition reaction starting temperature of the base electrode is higher by about 80° C. than that of the counter electrode. In the case where $HoBa_2Cu_3O_7$ is used as a material of the base electrode and $YbBa_2Cu_3O_7$ is used as a material of the counter electrode, the decomposition reaction starting temperature of the base electrode is higher by about 60° C. than that of the counter electrode. In the case where $DyBa_2Cu_3O_7$ is used as a material of the base electrode and $Yb_{0.8}Y_{0.2}Ba_2Cu_3O_7$ is used as a material of the counter electrode, the decomposition reaction starting temperature of the base electrode is higher by about 50° C. than that of the counter electrode. In the case where $GdBa_2Cu_3O_7$ is used as a material of the base electrode and $YbBa_2Cu_3O_7$ is used as a material of the counter electrode, the decomposition reaction starting temperature of the base electrode is higher by about 70° C. than that of the counter electrode. In the case where $NdBa_2Cu_3O_7$ is used as a material of the base electrode and $YbBa_2Cu_3O_7$ is used as a material of the counter electrode, the decomposition reaction starting temperature of the base electrode is higher by about 180° C. than that of the counter electrode. In the case where $LaBa_2Cu_3O_7$ is used as a material of the base electrode and $YbBa_2Cu_3O_7$ is used as a material of the counter electrode, the decomposition reaction starting temperature of the base electrode is higher by about 190° C. than that of the counter electrode. It is noted that values noted above were obtained by measuring decomposition reaction starting temperatures of oxide superconductor layers which were formed by sputtering method.

In the second embodiment of the present invention, the base electrode, i.e., the first superconductor layer, is an oxide superconductor layer comprising a material having a composition represented by the formula of $LnAE_2M_3O_x$. On the other hand, the counter electrode, i.e., the second superconductor layer, is an oxide superconductor layer comprising a material having a composition represented by the formula of $Ln'AE'_2M'_3O_z$, wherein the value of z falls within a range of 6.0 to 8.0, preferably a range of 6.0 to 7.5.

Figure 2:
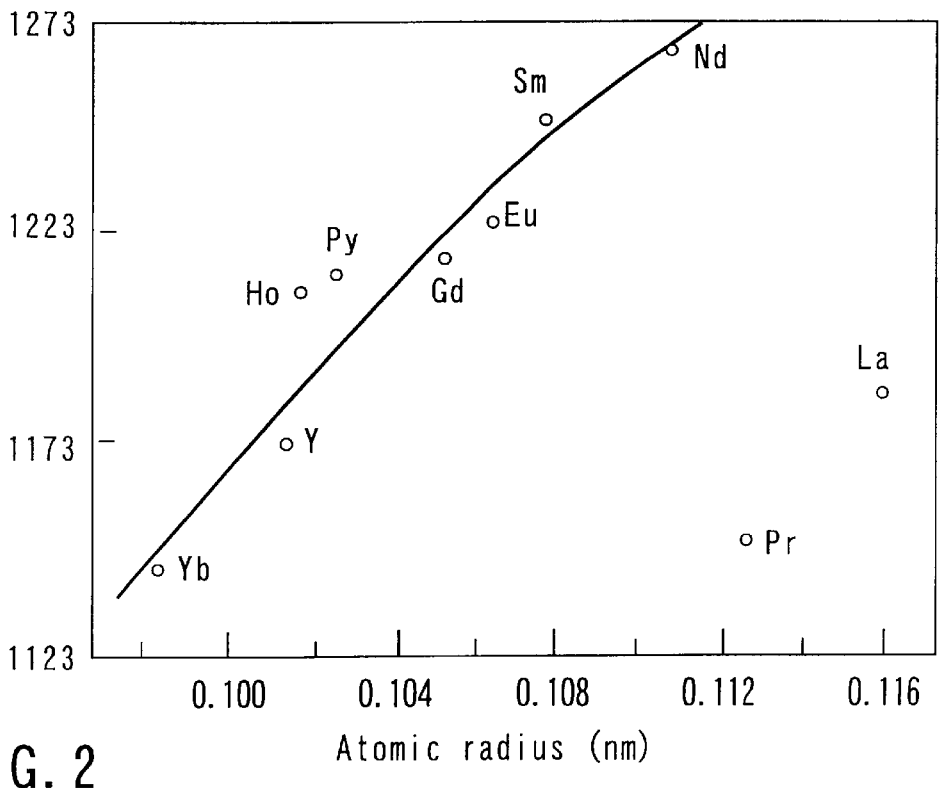
FIG. 2 is a graph showing the relationship between the decomposition temperature of the oxide superconductor with a composition represented by the formula of $LnAE_2M_3O_7$ and the atomic radius of the element Ln.

In the oxide superconductors of the formulas noted above, the atomic radius of the element Ln or the element Ln' is deeply related to the decomposition temperature, as apparent from FIG. 2.

FIG. 2 is a graph showing the relationship between the decomposition temperature of the oxide superconductor having a composition represented by the formula of $LnAE_2M_3O_7$ and the atomic radius of the element L. Specifically, the graph of FIG. 2 shows the relationship between the atomic radius of the element Ln and the decomposition reaction starting temperature relating to the oxide superconductor having a composition represented by the formula of $LnBa_2Cu_3O_7$ (LnBCO). The atomic radius is plotted on the abscissa of the graph, with the decomposition reaction starting temperature being plotted on the ordinate.

As shown in FIG. 2, the decomposition reaction starting temperature tends to be lowered with decrease in the atomic radius of the element Ln. Therefore, the effect described above can be obtained if an element having a greater atomic radius is used as the metal occupying the Ln site in the base electrode and if an element having a smaller atomic radius is used as the metal occupying the Ln site in the counter electrode. Incidentally, it is possible for the Ln site to be occupied by plural types of metals. In such a case, the effect described above can be obtained if the average atomic radius of the metals occupying the Ln site in the base electrode is larger than the average atomic radius of the metals occupying the Ln site in the counter electrode.

Some Examples of the present invention will now be described.

EXAMPLE 1

Figure 3:
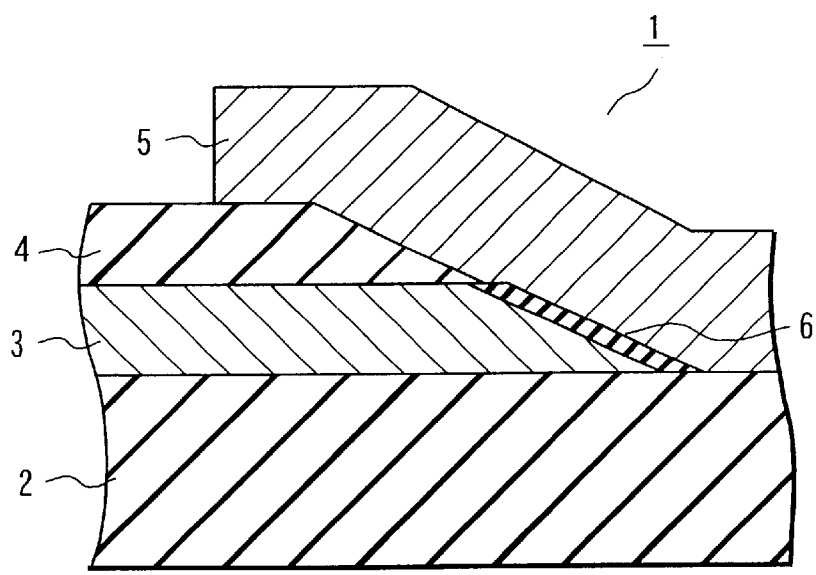
FIG. 3 is a cross sectional view schematically showing a superconducting device according to a first example of the present invention.

FIG. 3 is a cross sectional view schematically showing a superconducting device according to Example 1 of the present invention. The superconducting device shown in FIG. 3 is a ramp edge type Josephson device 1. The Josephson device 1 includes a base electrode 3, an interlayer insulation film 4 and a counter electrode 5, which are successively laminated on one main surface of a substrate 2. Each of the base electrode 3 and the interlayer insulation film 4 has an edge surface that is inclined relative to the main surface of the substrate 2. Also, the counter electrode 5 forms a junction with the base electrode 3 in the position of the inclined edge surface of the base electrode 3. In other words, a junction portion 6 is formed in the interface between the base electrode 3 and the counter electrode 5.

The Josephson device 1 shown in FIG. 3 can be manufactured by, for example, the method described below with reference to the process flow chart shown in FIG. 4.

Figure 4:
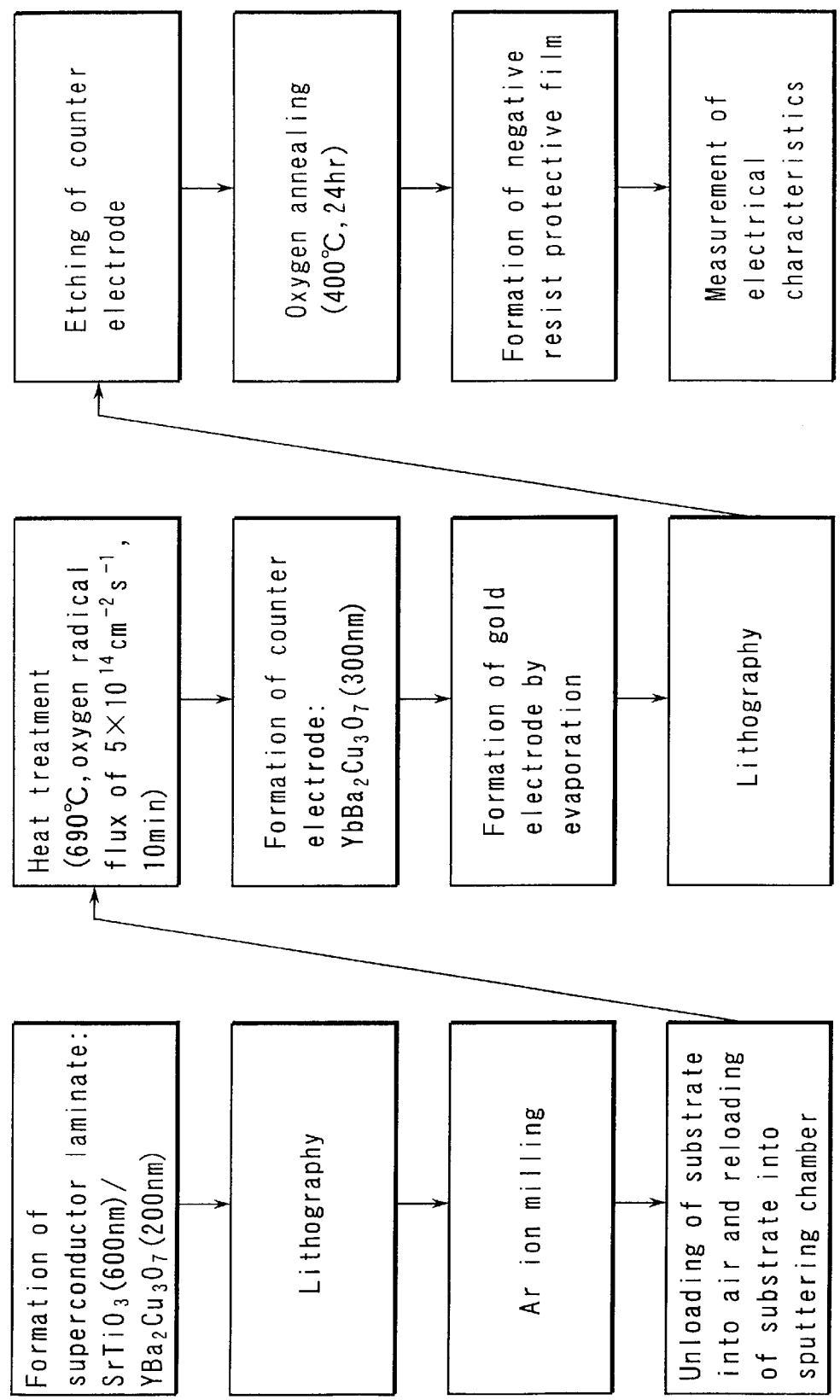
FIG. 4 is a process flow chart schematically showing the process of manufacturing the superconducting device according to the first example of the present invention.

Specifically, FIG. 4 is a process flow chart schematically showing the manufacturing method of the superconducting device 1 according to Example 1 of the present invention. In manufacturing the device 1, the substrate 2 made of $SrTiO_3$ and having the (100) plane exposed to the outside is prepared in the first step. Then, the base electrode 3 made of $YBaCu_3O_7$ and having a thickness of 200 nm and the interlayer insulation film made of $SrTiO_3$ and having a thickness of 600 nm are successively formed on the main surface of the substrate 2 having the (100) plane exposed to the outside. Incidentally, it is possible to employ, for example, a sputtering method, a laser abrasion method, an evaporation method and a CVD method for forming various thin films. In Example 1, a sputtering method is employed for forming the base electrode 3 and the interlayer insulation film 4.

In the next step, a resist pattern is formed on the interlayer insulation film 4 by using a photolithography technique. Further, an Ar ion milling is performed by using the resist pattern as a mask. Then, the substrate 2 is taken out into the air atmosphere, followed by transferring again the substrate 2 into the sputtering chamber.

Within the sputtering chamber, a heat treatment is applied for 10 minutes at 690° C. in the presence of oxygen radical of $5 \times 10^{14}$ $cm^{-2}s^{-1}$, followed by performing a sputtering treatment so as to form the counter electrode 5 made of $YBaCu_3O_7$ and having a thickness of 300 nm. Incidentally, the substrate temperature was set at 690° C. in forming the counter electrode 5.

In the next step, a metal electrode (not shown) is formed on the counter electrode 5 by an evaporation method, followed by patterning the counter electrode 5 and the metal electrode noted above by employing a lithography method and an etching method. Then, an oxygen annealing is performed for 24 hours at a temperature of 400° C. so as to form a negative resist protective layer (not shown), thereby obtaining the superconducting device 1 shown in FIG. 3. Incidentally, the thickness of the interlayer insulation film 4 is lowered to 200 nm in the manufactured superconducting device 1.

Figure 5:
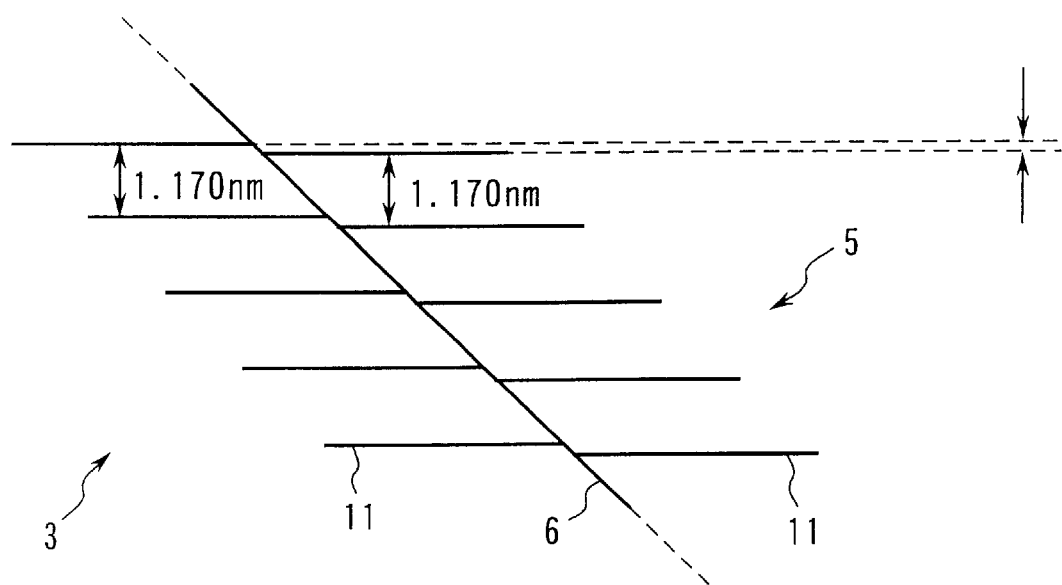
FIG. 5 is a cross sectional view schematically showing the junction portion of the superconducting device according to the first example of the present invention.

FIG. 5 schematically shows the junction portion 6 of the superconducting device 1 thus obtained. According to the process described above, the crystal lattice of the base electrode 3 is displaced from the crystal lattice of the counter electrode 5 in the junction portion 6 of the superconducting device 1. By the observation of the junction portion 6 with a transmission type electron microscope, it has been confirmed that the $CuO_2$ planes 11 in the base electrode 3 and the $CuO_2$ planes 11 in the counter electrode 5, which are arranged at a period of 1.170 nm, are displaced from each other in the direction perpendicular to the main surface of the substrate 2, and that the displacement therebetween in the direction perpendicular to the main surface of the substrate 2 is within a range of 0.01 nm to 0.6 nm.

Figure 6:
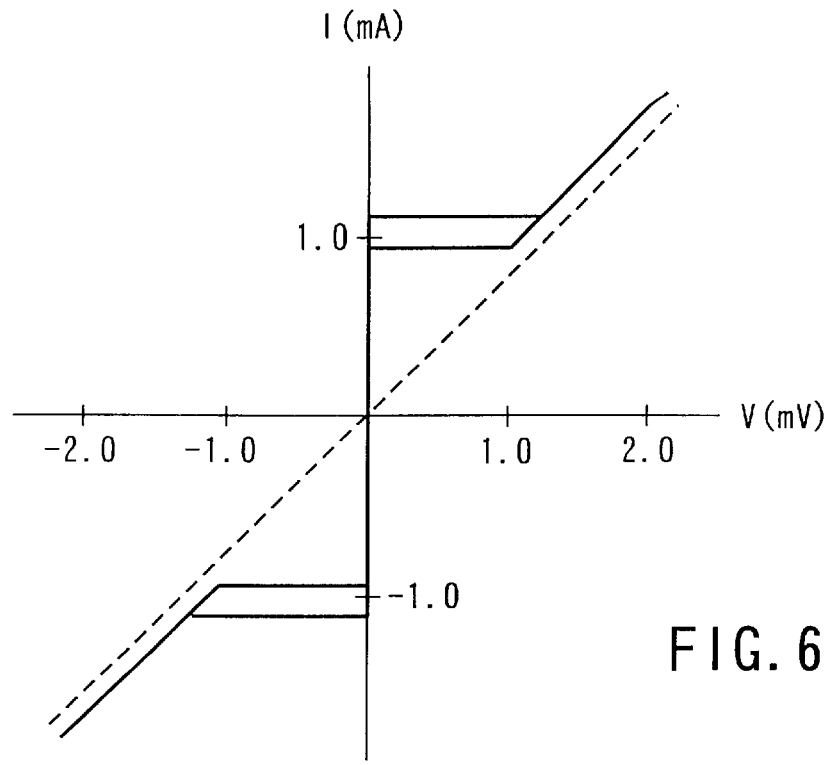
FIG. 6 is a graph showing the electrical characteristics of the superconducting device according to the first example of the present invention.

The electrical characteristics of the superconducting device 1 thus obtained were measured, with the results as shown in FIG. 6. Specifically, FIG. 6 is a graph showing the electrical characteristics of the superconducting device 1 for Example 1. The voltage value is plotted on the abscissa of the graph, with the current value being plotted on the ordinate. The data given in FIG. 6 are based on the results of the measurements which were obtained in respect of 100 pieces of superconducting devices 1 which were formed on a chip of 3 mm□.

As shown in FIG. 6, the superconducting device 1 for Example 1 exhibited satisfactory characteristics that the mean value of $I_c$ was 1.1 mA and the standard deviation was 8%. On the other hand, a conventional superconducting device was also prepared by the method described above, except that $YBaCu_3O_7$ was used for forming the counter electrode 5, and that the substrate temperature was set at 750° C. in forming the counter electrode 5. In this prior art, the mean value of $I_c$ was 5 mA and the standard deviation was 30%. In other words, it has been confirmed that Example 1 permits markedly improving the electrical characteristics of the superconducting device.

EXAMPLE 2

Superconductor elements 1 as shown in FIG. 3 were prepared as in Example 1, except that the compositions of the base electrode 3 and the counter electrode 5 were changed, and the electrical characteristics of each of these superconducting devices were measured, with the results as shown in Table 1. Incidentally, the mean value of $L_s$ of the wiring portion and the standard deviation thereof are what was obtained on the basis of 10 wiring portions.

As shown in Table 1, the controllability of the $I_c$ value was improved and the standard deviation was markedly lowered in each of samples [1] and [3] to [5] in which an oxide superconductor other than $YBaCu_3O_7$ was used for forming the base electrode 3 and in sample [2] in which Yb in the counter electrode 5 was partly replaced by Ba, compared with the prior art in which $YBaCu_3O_7$ was used for forming both the base electrode 3 and the counter electrode 5. In other words, satisfactory electrical characteristics were obtained in all of samples [1] to [5].

EXAMPLE 3

Figure 7:
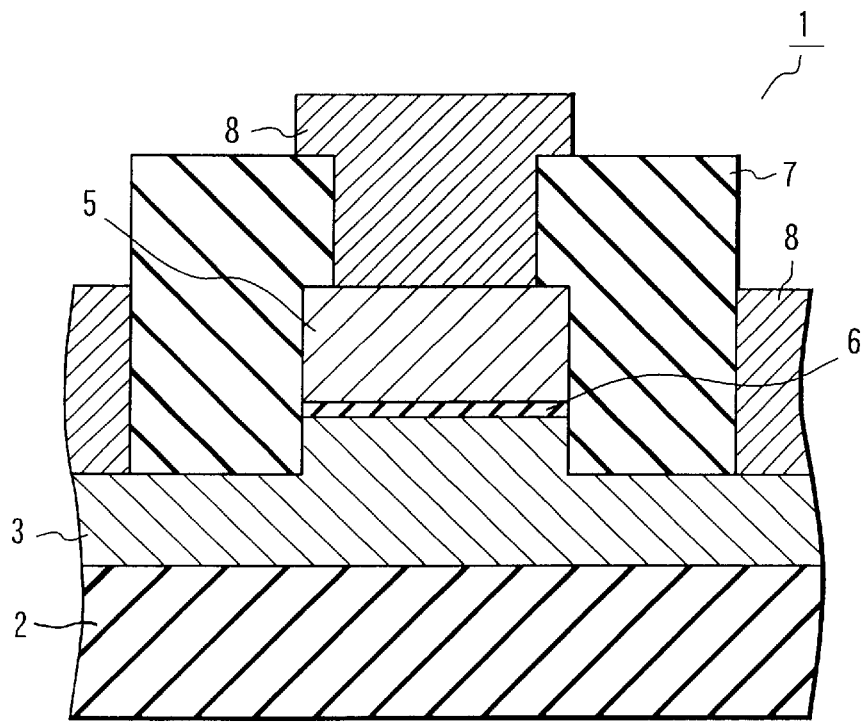
FIG. 7 is a cross sectional view schematically showing a superconducting device according to a third example of the present invention.

FIG. 7 is a cross sectional view schematically showing a superconducting device according to Example 3 of the present invention. The superconducting device shown in FIG. 7 is a laminated type Josephson device 1. In the superconducting device 1, the base electrode 3, the counter electrode 5, an insulation film 7 made of SiO and a metal electrode 8 are successively laminated on one main surface of the substrate 2. As shown in the drawing, the junction portion 6 is formed at the interface between the base electrode 3 and the counter electrode 5. The superconducting device 1 shown in FIG. 7 was prepared by the process substantially equal to the process described previously in conjunction with Example 1. Incidentally, Example 3 is equal to Example 1 in the materials and the thicknesses of the substrate 2, the base electrode 3 and the counter electrode 5 as well as in the heat treating temperature and the substrate temperature.

Figure 8A:
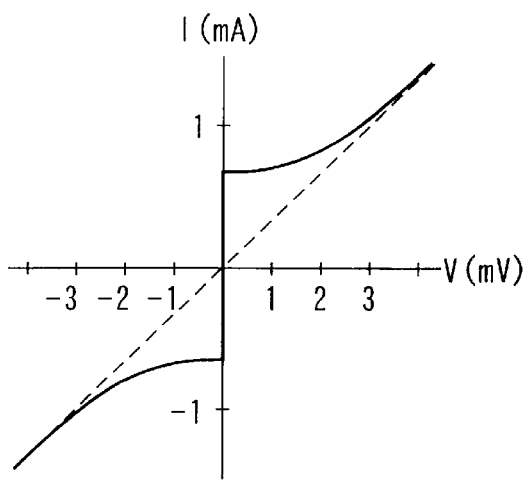
FIGS. 8A and 8B are graphs each showing the electrical characteristics of the superconducting device according to the third example of the present invention.
Figure 8B:
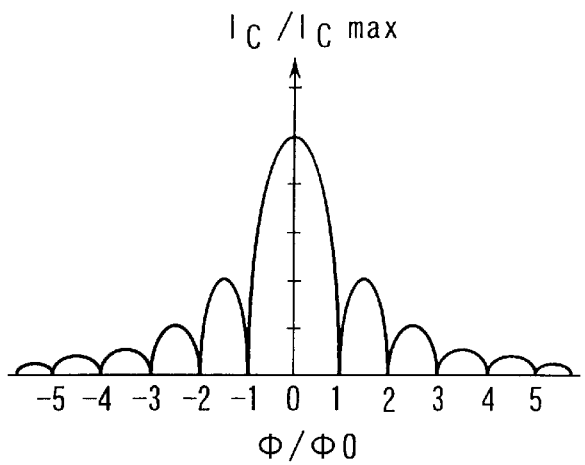

The electrical characteristics of the superconducting device 1 thus obtained were measured, with the results as shown in FIGS. 8A and 8B.

Specifically, FIGS. 8A and 8B are graphs each showing the electrical characteristics of the superconducting device 1 according to Example 3 of the present invention. In the graph of FIG. 8A, the voltage value is plotted on the abscissa, with the current value being plotted on the ordinate. On the other hand, in the graph shown in FIG. 8B, the applied magnetic field after normalization is plotted on the abscissa, with the $I_c$ value after normalization being plotted on the ordinate. As shown in FIGS. 8A and 8B, a marked improvement in the electrical characteristics were recognized in the superconducting device 1 for Example 3 such that the controllability of the $I_c$ value was improved and that the standard deviation was lowered to about 8%.

TABLE 1

| | Sample | [1] | [2] | [3] | [4] | [5] |
|---|---|---|---|---|---|---|
| Composition | Counter electrode | $YbBa_2Cu_3O_7$ | $Yb_{0.8}YO_{.2}Ba_2Cu_3O_7$ | $YbBa_2Cu_3O_7$ | $YbBa_2Cu_3O_7$ | $YbBa_2Cu_3O_7$ |
| | Base electrode | $HoBa_2Cu_3O_7$ | $DyBa_2Cu_3O_7$ | $GdBa_2Cu_3O_7$ | $NdBa_2Cu_3O_7$ | $LaBa_2Cu_3O_7$ |
| $I_C$ | Mean value (mA) | 0.60 | 0.65 | 0.80 | 0.75 | 0.70 |
| | Standard deviation (%) | 7.2 | 4.5 | 5.0 | 3.0 | 7.0 |
| $L_S$ | Mean Value ($\times 10^{-12}$H) | 0.60 | 0.65 | 0.80 | 0.50 | 0.65 |
| | Standard deviation (%) | 2.5 | 2.2 | 3.5 | 2.0 | 4.0 |
| $J_C$ | Counter electrode | $5.0 \times 10^7$ | $4.5 \times 10^7$ | $6.5 \times 10^7$ | $7.5 \times 10^7$ | $6.5 \times 10^7$ |
| (A cm$^{-2}$) | Base electrode | $2.0 \times 10^7$ | $2.5 \times 10^7$ | $2.5 \times 10^7$ | $5.2 \times 10^7$ | $2.7 \times 10^7$ |

EXAMPLE 4

A superconducting device 1 as shown in FIG. 3 was prepared as in Example 1, except that some conditions were changed as shown in Table 2.

TABLE 2

|  | Film formation for base electrode: $SrTiO_3$ (600 nm)/ $YBa_2Cu_3O_7$(200 nm) | Etching | Heat treatment | Film formation for counter electrode: $YbBa_2Cu_3O_7$(300 nm) |
|---|---|---|---|---|
| Method utilized | Sputtering | Ar ion milling using RF excitation (acceleration voltage of 200 V) | Performed after ex-situ transferring into sputtering chamber | Sputtering |
| Temperature of substrate | 770° C. | Room temperature | 710° C. | 690° C. |
| Gas condition | Ar: 100 sccm $O_2$: 50 sccm ($O_2$ partial pressure of 100 mTorr) | Ar: 20 sccm | 100 mTorr of molecular oxygen or active oxygen with flux of $5 \times 10^{14}$ $cm^{-2}S^{-1}$ | Ar: 100 sccm $O_2$: 50 sccm ($O_2$ partial pressure of 100 mTorr) |
| Duration | 4 hours | 40 minutes | 10 minutes | 4 hours |

In Example 4, the substrate temperature in the heat treatment step was higher than that in Example 1 and, thus, the mean value of $I_c$ was increased. However, the standard deviation of the $I_c$ was maintained at a level not higher than 8%. In other words, it has been confirmed that the superconductor 1 for Example 4 exhibits satisfactory electrical characteristics. It has also been clarified that the substrate temperature functions as a semi-independent parameter for controlling the $I_c$ value.

EXAMPLE 5

Figure 9:
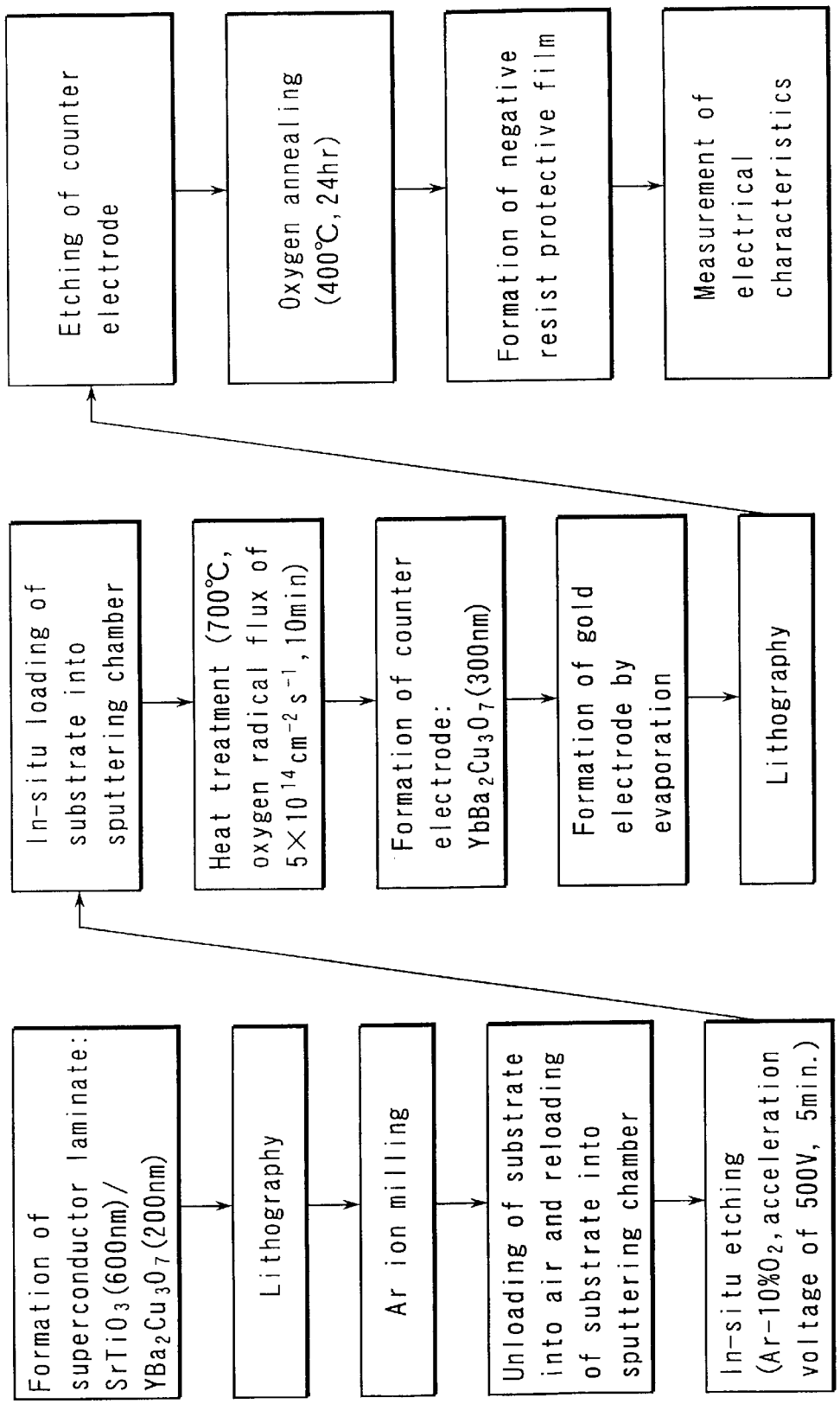
FIG. 9 is a process flow chart schematically showing a process of manufacturing a superconducting device according to a fifth example of the present invention.

A superconducting device 1 as shown in FIG. 3 was prepared substantially as in Example 4, except that the sample transfer between the ion milling step and the subsequent heat treating step and between the ion milling step and the subsequent step of forming the counter electrode 5 was performed in-situ. The various conditions employed in Example 5 are shown in Table 3. Also, FIG. 9 is the process flow chart showing the manufacturing method of the superconducting device 1 for Example 5.

The substrate temperature in the heat treating step for Example 5 was further higher than that for Example 4. However, it was possible to obtain a desired mean value of $I_c$. Also, the standard deviation of the $I_c$ value obtained in respect of 100 junctions was further lower than that in the case where the in-situ etching was not employed, supporting that the superconducting device 1 for Example 5 of the present invention exhibits more satisfactory electrical characteristics.

EXAMPLE 6

A superconducting device 1 as shown in FIG. 3 was prepared by a method similar to the method employed in Example 1, except that some conditions were changed as shown in Table 4. Incidentally, in Example 6, $NdBa_2Cu_3O_7$ having a decomposition starting temperature higher by 80° C. than that of $YBa_2Cu_3O_7$ was used as a material for forming the base electrode 3, and $YBa_2Cu_3O_7$ was used as a material for forming the counter electrode 5.

TABLE 3

|  | Film formation for base electrode: $SrTiO_3$ (600 nm)/ $YBa_2Cu_3O_7$(200 nm) | Etching | Heat treatment | Film formation for counter electrode: $YbBa_2Cu_3O_7$(300 nm) |
|---|---|---|---|---|
| Method utilized | Sputtering | ECR etching (acceleration voltage of 500 V) | Performed after ex-situ transferring into sputtering chamber | Sputtering |
| Temperature of substrate | 770° C. | Room temperature | 770° C. | 690° C. |
| Gas condition | Ar: 100 sccm $O_2$: 50 sccm ($O_2$ partial pressure of 100 mTorr) | Ar: 20 sccm $O_2$: 1 sccm | 100 mTorr of molecular oxygen or active oxygen with flux of $5 \times 10^{14}$ $cm^{-2}S^{-1}$ | Ar: 100 sccm $O_2$: 50 sccm ($O_2$ partial pressure of 100 mTorr) |
| Duration | 3 hours | 60 minutes | 10 minutes | 4 hours |

TABLE 4

| | Film formation for base electrode: SrTiO$_3$ (600 nm)/ NdBa$_2$Cu$_3$O$_7$(200 nm) | Etching | Heat treatment | Film formation for counter electrode: YbBa$_2$Cu$_3$O$_7$(300 nm) |
|---|---|---|---|---|
| Method utilized | Sputtering | Ar ion milling using RF excitation (acceleration voltage of 200 V) | Performed after ex-situ transferring into sputtering chamber | Sputtering |
| Temperature of substrate | 870° C. | Room temperature | 770° C. | 770° C. |
| Gas condition | Ar: 20 sccm O$_2$: 20 sccm | Ar: 20 sccm | | Ar: 50 sccm O$_2$: 20 sccm (Total pressure of 40 Pa) |
| Duration | 3.5 hours | 45 minutes | 10 minutes | 4 hours |

Figure 10:
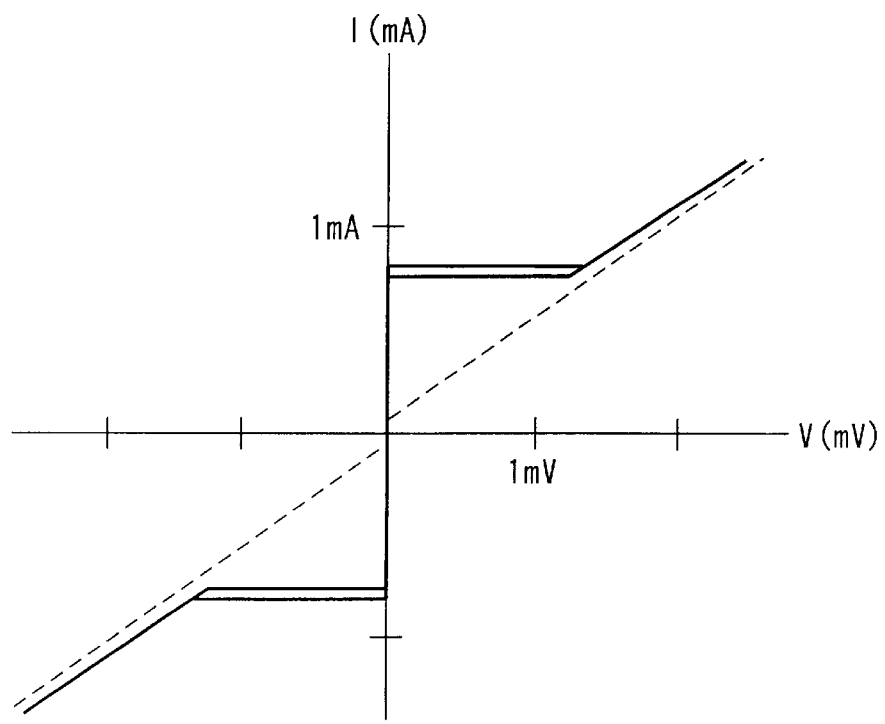
FIG. 10 is a graph showing the electrical characteristics of a superconducting device according to a sixth example of the present invention.

The electrical characteristics of the superconducting device 1 thus obtained were measured, with the results as shown in FIG. 10.

Specifically, FIG. 10 is a graph showing the electrical characteristics of the superconducting device 1 according to Example 6 of the present invention. In the graph of FIG. 10, the voltage value is plotted on the abscissa, with the current value being plotted on the ordinate. Incidentally, the data given in FIG. 10 are based on the results of the measurements which were obtained in respect of 100 pieces of superconducting devices 1 which were formed on a chip of 3 mm□.

As shown in FIG. 10, the superconducting device 1 for Example 6 exhibited a mean value of $I_c$ of 0.8 mA, its standard deviation of 5.5%, and a mean value of $R_n$ of 2.0 Ω. In other words, it has been confirmed that the superconducting device 1 for Example 6 exhibits excellent characteristics, although the substrate temperature was set at a high temperature of 770° C. in the step of forming the counter electrode 5.

EXAMPLE 7

A superconducting device 1 as shown in FIG. 3 was prepared by a method similar to the method employed in Example 6, except that SmBa$_2$Cu$_3$O$_7$ was used as a material of the base electrode 3, and that ErBa$_2$Cu$_3$O$_7$ was used as a material of the counter electrode 5. Incidentally, the decomposition reaction starting temperature for SmBa$_2$Cu$_3$O$_7$ is higher by about 40° C. than the decomposition reaction starting temperature of ErBa$_2$Cu$_3$O$_7$.

The electrical characteristics of the superconducting device 1 thus prepared were measured, with the result that the superconducting device 1 for Example 7 exhibited a mean value of $I_c$ of 1.2 mA, its standard deviation of 7.5%, and a mean value of $R_n$ of 1.5 Ω. In other words, it has been confirmed that the superconducting device 1 for Example 7 exhibits excellent characteristics, although the substrate temperature was set at a high temperature of 770° C. in the step of forming the counter electrode 5.

As described above, it is possible in the present invention to enlarge the overlapping region between the range of the substrate temperature within which the counter electrode can be formed with a desired orientation and the range of the substrate temperature within which a desired $I_c$ value can be realized by using a material, which is capable of forming a film in a desired orientation even if the substrate temperature is rendered relatively low, for forming the counter electrode. It follows that it is possible in the present invention to optimize easily both the critical current value of the junction and the inductance of the wiring portion.

As described above, the present invention provides a superconducting device capable of optimizing easily both the critical current value of the junction and the inductance value of the wiring portion and a method of manufacturing such a device.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a superconducting device, comprising:

subjecting a first superconductor layer, which is supported by a substrate and containing superconductor of oxide, to an etching treatment;

subjecting the first superconductor layer to a heat treatment after the etching treatment; and forming a second superconductor layer on the first superconductor layer after the heat treatment, the second superconductor layer comprising a material represented by a formula of $(Yb_{1-y}Ln'_y)AE'_2M'_3O_z$ in which Ln' represents at least one metal selected from the group comprising Y and lanthanoids, AE' represents at least one of alkaline earth metals, M' represents a metal which contains 80 atomic % or more of Cu, y represents a value within a range of 0 to 0.9, and z represents a value within a range of 6.0 to 8.0, wherein the heat treatment is an annealing treatment, the heat treatment is performed on the first superconductor layer whose surface is uncovered, a temperature of the substrate on the formation of the second superconductor layer is lower than a temperature of the substrate on the heat treatment, and the second superconductor layer is in contact with an etched surface of the first superconductor layer.

2. The method according to claim 1, wherein AE' represents at least one metal selected from the group comprising Ca, Ba, and Sr, and z represents a value within a range of 6.0 to 7.5.

3. The method according to claim 1, wherein the first superconductor layer comprises Ln, AE, M, and O, wherein Ln represents at least one metal selected from the group comprising Y and lanthanoids, AE represents at least one of alkaline earth metals, and M represents a metal which contains 80 atomic % or more of Cu.

4. The method according to claim 3, wherein the first superconductor layer comprises a material represented by a formula of $LnAE_2M_3O_x$ in which x represents a value within a range of 6.0 to 8.0.

5. The method according to claim 4, wherein a mean atomic radius of Ln in the first superconductor layer is larger than a mean atomic radius of Yb and Ln' in the second superconductor layer.

6. The method according to claim 3, wherein each of AE and AE' represents at least one metal selected from the group comprising Ca, Ba, and Sr, and z represents a value within a range of 6.0 to 7.5.

7. The method according to claim 6, wherein the first superconductor layer comprises a material represented by a formula of $LnAE_2M_3O_x$ in which x represents a value within a range of 6.0 to 7.5.

8. The method according to claim 1, wherein the first superconductor layer comprises Ln, AE, M, and O, wherein Ln represents at least one metal selected from the group comprising Y and lanthanoids, AE represents at least one of alkaline earth metals, and M represents a metal which contains 80 atomic % or more of Cu, and wherein a decomposition temperature of the first superconductor layer is higher than a decomposition temperature of the second superconductor layer.

9. The method according to claim 8, wherein the decomposition temperature of the first superconductor layer is higher by at least 30° C. than the decomposition temperature of the second superconductor layer.

10. The method according to claim 8, wherein the first superconductor layer comprises a material represented by a formula of $LnAE_2M_3O_x$ in which x represents a value within a range of 6.0 to 8.0.

11. The method according to claim 8, wherein the first superconductor layer comprises a material represented by a formula of $(Yb_{1-w}Ln_w)AE_2M_3O_x$ in which w represents a value within a range of 0 to 0.9 and x represents a value within a range of 6.0 to 8.0.

* * * * *